United States Patent [19]

Krenicki et al.

[11] 3,866,068

[45] Feb. 11, 1975

[54] FREQUENCY VARYING OSCILLATOR CIRCUIT VIBRATORY CLEANING APPARATUS

[75] Inventors: Joseph Krenicki, Danbury; Raymond L. Hunicke, Roxbury, both of Conn.

[73] Assignee: Lewis Corporation, Woodbury, Conn.

[22] Filed: Mar. 20, 1974

[21] Appl. No.: 452,838

[52] U.S. Cl. .................... 310/8.1, 310/26, 318/116, 128/62 A

[51] Int. Cl. .............................................. H01v 7/00

[58] Field of Search ....... 310/8.1, 26; 318/116, 118; 128/62 A, 24 A; 32/58, 26, DIG. 4

[56] References Cited

UNITED STATES PATENTS 3,651,352 3/1972 Puskas ................................ 310/8.1

3,668,486 6/1972 Silver ................................ 318/116

3,828,770 8/1974 Kuris et al. ...................... 128/62 A

*Primary Examiner*—Mark O. Budd

*Attorney, Agent, or Firm*—Mattern, Ware & Davis

[57] ABSTRACT

A feedback oscillator circuit provides a load waveform which is intentionally distorted, delivering plural and shifting frequency energy to and from a piezoelectric crystal transducer which operates an ultrasonic cleaner; the transducer is thus made to vibrate in timed bursts, while automatically shifting between different predominant frequencies during each burst. By adjusting specific circuit components, the duration and timing of predominant frequencies generated by the circuit is controlled. This automatic frequency shifting mode of operation provides improved cavitation, controllable for a specific desired result, and therefore provides superior cleaning in the cleaning tank.

8 Claims, 11 Drawing Figures

FREQUENCY VARYING OSCILLATOR CIRCUIT VIBRATORY CLEANING APPARATUS

BACKGROUND OF THE INVENTION

This invention relates to frequency-varying oscillator circuits, producing complex or composite-frequency load waveforms, and more particularly to oscillator circuits for use with sonic or ultrasonic cleaning apparatus providing timed bursts or pulse envelopes of oscillatory energy, with automatic shifting in mid-pulse between different predominant frequencies.

Generally, sonic cleaning apparatus comprises a cleaning tank containing a cleaning solution, and an electrical generator circuit. The generator circuit receives 60 Hz alternating current as its driving voltage, and delivers a load waveform to a magnetostrictive or electrostrictive transducer which is mounted on the cleaning tank.

The cleaning performance achieved in such ultrasonic cleaning tanks varies considerably, and is affected by temperature, tank geometry, transducer location, bath composition and many similar factors. Many variations in these factors have been proposed in order to maximize cleaning performance.

It is known that cleaning is improved when multiple frequencies are produced by the transducer, causing improved cavitation of the cleaning solution, thereby improving the removal of soil from the object to be cleaned. It has now been found that shifting between different ratios of predominantly low frequency and predominantly high frequency vibratory energy from the transducer provides the best cleaning action.

OBJECTS OF THE INVENTION

It is a principal object of this invention to provide electrical oscillator circuits for use with a transducer and cleaning tank which provides improved cleaning performance.

Another object of this invention is to provide such electrical oscillator circuits which are both inexpensive to manufacture and reliable in operation.

A further object of this invention is to provide such electrical oscillator circuits which are capable of automatically shifting between predominantly low frequencies and predominantly high frequencies of vibratory energy.

Other and more specific objects will be apparent from the features, elements, combinations and operating procedures disclosed in the following detailed description and shown in the drawings.

SUMMARY OF THE INVENTION

The oscillator circuit of the present invention receives 115 volt, 60 Hz., alternating current, and is constructed to produce a plurality of shifting frequency responses from a piezoelectric crystal transducer. A half-wave rectifier is incorporated in one preferred embodiment, thereby producing the driving voltage only during each positive half cycle of the input voltage. It has also been found that a full-wave rectifier with minimal filtering provides satisfactory input, and thus provides higher power rates. The circuit also employs a single ferrite core transformer with a feedback loop winding which helps generate the automatic shifting between the predominantly low and predominantly high frequencies.

The oscillator circuit of this invention incorporates a capacitor shunted across the primary winding of the transformer. By altering the capacitance of this capacitor, it is possible to control the duration and timing of the automatic shifting between the predominantly low and predominantly high frequencies generated by the circuit and delivered to the transducer.

The invention accordingly comprises the features of construction, combinations of elements, and arrangements of parts which will be exemplified in the construction hereinafter set forth, and the scope of the invention will be indicated in the claims.

THE DRAWINGS

For a fuller understanding of the nature and objects of the invention, reference should be had to the following detailed description taken in connection with the accompanying drawings, in which.

DETAILED DESCRIPTION

Figure 1:
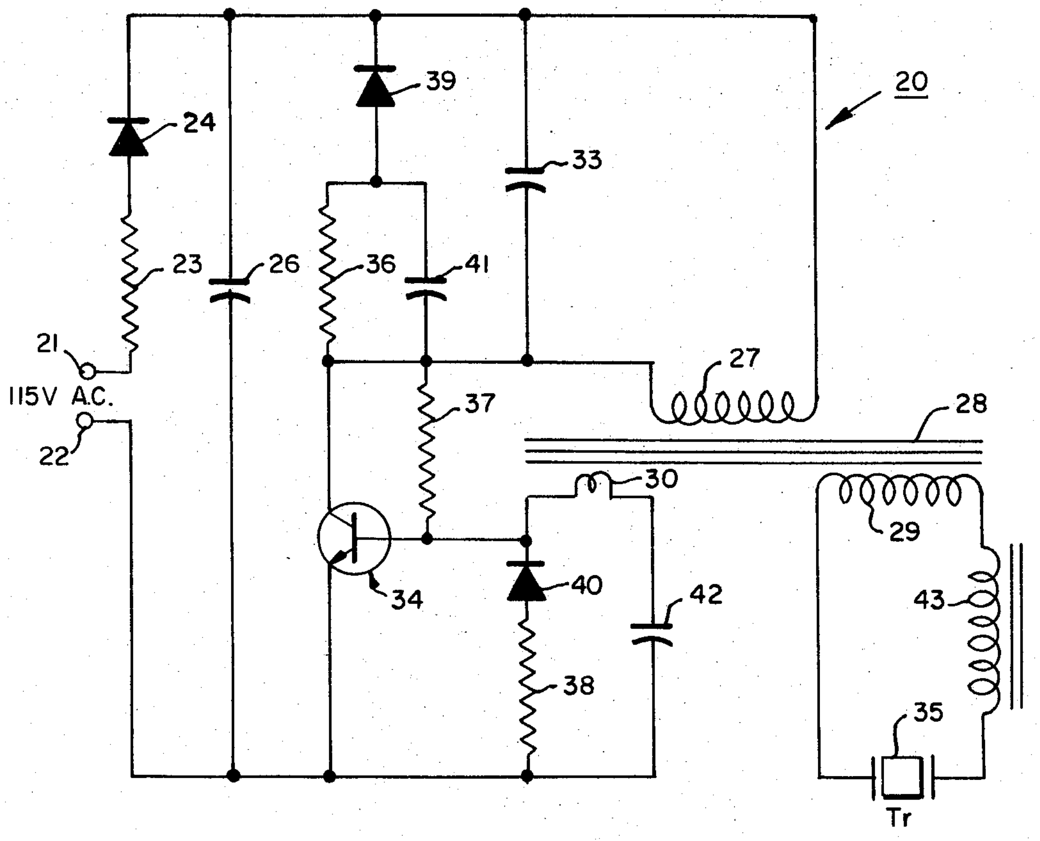
FIG. 1 is a schematic diagram of an oscillator circuit of this invention.
Figure 2:
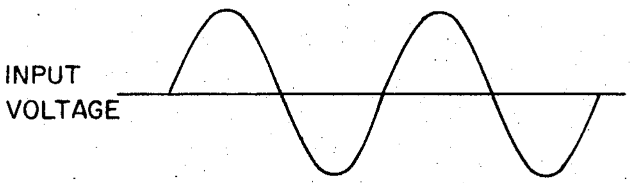
FIG. 2 is a diagram of the input voltage to the circuit of this invention.
Figure 3:
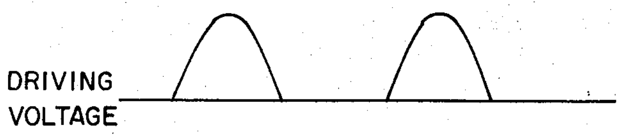
FIG. 3 is a diagram of the driving voltage employed by the circuit of this invention.

FIG. 1 schematically illustrates an electrical oscillator circuit 20 in one form of this invention. The input voltage to circuit 20 at interconnection points 21 and 22 is 115 volt, 60Hz., alternating current, as shown in FIG. 2. The input voltage at line terminal 21 flows through a resistor 23 and a diode 24 only during the positive half cycle portion of the sinusoidal waveform. The combination of resistor 23, diode 24 and capacitor 26, which is shunted across line terminals 21 and 22, forms a half-wave rectifier which allows only the positive portion of the input voltage to be delivered to the remainder of the circuit while no input current is drawn during the negative portion of the cycle. This resulting half-wave pulsed driving voltage is shown in FIG. 3.

Figure 11:
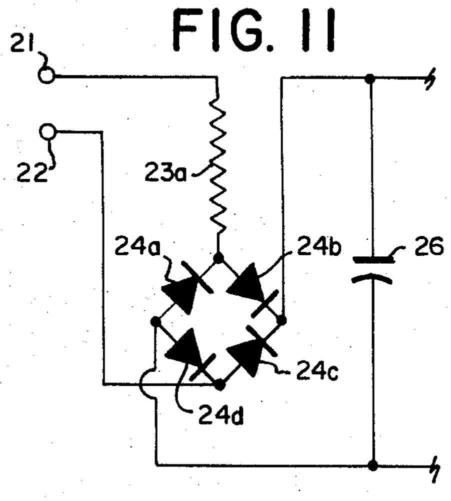
FIG. 11 is a partial schematic diagram of a full-wave rectifier power supply incorporated in another embodiment of the invention.

FIG. 11 shows an alternative full-wave rectifier power supply, employing four diodes, **24*a*, 24*b*, 24*c* and 24*d*. If this four-diode full-wave rectifier is substituted for diode 24**, the current flow will continue as a direct current pulse during each half of the sinusoidal input waveform.

A transformer 28, preferably incorporating a toroidal ferrite core, has a primary winding 27, a secondary winding 29, and a feedback winding 30. The primary winding 27 is connected in parallel to a capacitor 33 and is connected to rectifier diode 24 and to the collector of a switching transistor 34. The secondary winding 29 is connected to a transducer 35 in series with a choke 43, while the feedback winding 30 is connected through capacitor 42 to the base and emitter of switching transistor 34 via bias resistor 38 and diode 40.

Across primary winding 27 are two branches in parallel, with capacitor 33 forming one branch, and in the other branch a diode 39 in series with a capacitor 41 shunted by a resistor 36. Resistor 37, connected across the base and collector terminals of transistor 34, establishes a bias on the transistor base.

In the illustrated embodiment, circuit 20 comprises the following components:

| Component | Type |
|---|---|
| Resistor 23 | 10 ohms |
| Resistor 36 | 350 ohms |
| Resistor 37 | 10 kilohms |
| Resistor 38 | 5.6 ohms |
| Capacitor 26 | 1 microfarad |
| Capacitor 33 | 0–0.004 microfarads |
| Capacitor 41 | 0.22 microfarads |
| Capacitor 42 | 0.20 microfarads |
| Diode 24 | |
| Diode 39 | |
| Diode 40 | |
| Transistor 34 | Similar to GE D44 R2 |
| Transducer 35 | Piezoelectic crystal disk ⅛" thick, 1" diameter |

Resistor 36 delays the onset of a frequency shift in each half-wave envelope in response to cyclical voltage changes. If resistor 36 is small, it triggers the shift from predominantly low to predominantly high frequencies at an earlier point on each half-wave envelope. Therefore, resistor 36 directly influences the precentage of frequency dominance in each half-wave wave envelope. Diode 39 merely serves as a current block to resistor 36 and capacitor 41 in order to preserve a unidirectional flux in the primary winding 27, and also to prevent current from by-passing the transformer primary during opposite polarity.

In operation, the half-wave driving current resulting after passage through rectifier diode 24 in FIG. 1 (or the four-diode full wave rectifier of FIG. 11) is delivered to the primary winding 27 of transformer 28 and thence to the collector terminal of transistor 34.

As the driving current is delivered to the ferrite core transformer 28, flux builds up in the feedback winding 30, producing a complex base emitter waveform. This base emitter waveform has peaks that intrude into the positive region and a more complex negative cycle, as shown in the reversed or inverted characteristic waveform of FIG. 8.

The transistor 34 turns on or off depending on whether the peak is positive or negative respectively. By varying the base-emitter waveform distortions, the on and off times of transistor 34 are varied, and this varies the pulsing pattern of transducer 35, causing the transducer to respond with variations in frequency. The pattern of frequency variation is cyclicly repeated in response to the cycling amplitude of the 60 cycle input envelope.

The base-emitter waveform distortions are controlled by choices in values of components 30, 33, 36, 37, 38, 41, 42, 43 and the presence of diodes 39 and 40, and by the nonlinear characteristics of the ferrite core of transformer 28. Together, these choices add up to controlling the on/off times of transistor 34 in a frequency pattern continuously shifted by the input 60 cycle sine waveform.

There are several non-linear components with variable characteristics that contribute to a voltage-sensitive frequency shift phenomenon. The non-linear components are: the piezoelectric transducer 35; the transformer 28, which can be chosen to have flux path saturation as the voltage (current) approaches its peak; and the combination of diode 39, resistor 36 and capacitor 41. Utilizing the parallel resistor and capacitor circuit with the blocking diode, the effective capacitance across the primary 27 is not the same during positive and negative polarities across the primary. This non-linear behavior is significant in creating the complex shifting between different, dominant, output frequencies during each line frequency pulse. Together, these voltage-sensitive non-linear impedances provide a means to generate bursts of pulses at different frequencies from each 60 cycle half wave of either polarity. In this response to the 60 cycle voltage variation, distortions move into and out of the positive region of the waveform as multiple secondary peaks. These positive peaks operate the transistor 34 as a switch to provide the shift between predominantly high and predominantly low frequencies at an intermediate point during each half-wave cycle.

With half wave rectification, the flux pulse builds up in the toroid of transformer 28 sixty times a second. With the full-wave rectifier power supply of FIG. 11 substantially unfiltered pulses are delivered to the transformer 120 times per second. This modulating pulse envelope imparts a similar variation in flux magnitude through the transformer by way of feedback winding 30. Similarly, the base emitter feedback from the toroid reflects the 60-cycle magnitude variations. This sensing of changing magnitudes translates into a raising and lowering of the base emitter waveform's negative loop originally positioned just below the threshold level.

Figure 4:
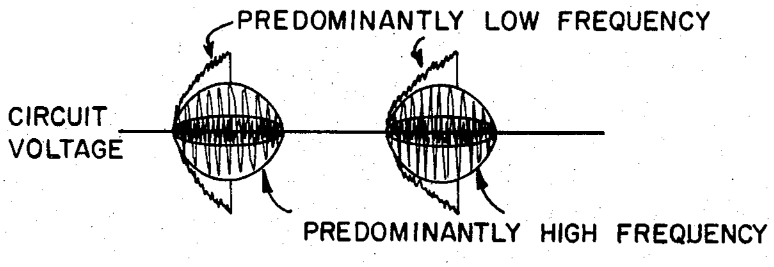
FIG. 4 is a diagram showing the pulse envelopes of the load current delivered to the crystal transducer.

Initially, the transistor starts operating at the fundamental frequency. At a point between zero and the pulse amplitude peak, the below-threshold loop crosses the transistor threshold, becoming positive and shifts the transistor oscillation predominantly to a higher frequency than the fundamental. Transistor 34 locks into this frequency for the remainder of the 60-cycle envelope. FIG. 4 schematically represents a typical load waveform produced by circuit 20 and delivered to transducer 35, and FIG. 5 shows an actual oscilloscope trace of such a waveform.

It has been found that by adjusting the value of capacitor 33, the percentage distribution of predominant frequencies present during each pulse or cycle can be changed. This changes the load impedance, which relfects in the ferrite flux change, which in turn shifts the base emitter threshold loop.

In order to study the shifting frequency responses produced by circuit 20 of this invention and delivered to the piezoelectric crystal transducer 35, several different oscilloscope traces were made and photographed. FIGS. 5 through 10 are reproductions of these photographs and by referring to them, the operation of the circuit of this invention can best be understood.

Figure 5:
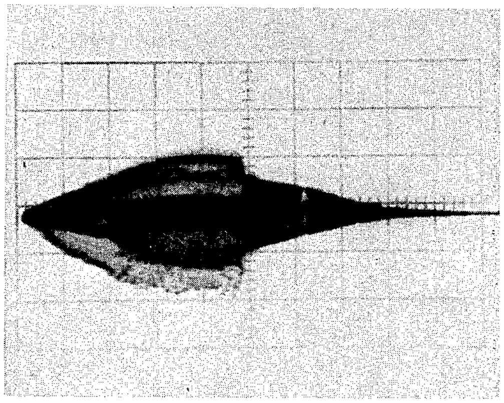
FIGS. 5 and 6 are photographs of an oscilloscope display showing one 60-cycle pulse envelope of the oscillator output current delivered to the crystal transducer at different levels of capacitance.
Figure 6:
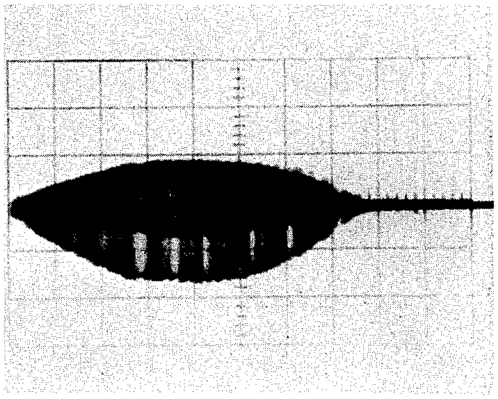

FIGS. 5 and 6 show a single 60-cycle "half-wave" pulse envelope of the voltage produced by the oscillator circuit 20 and fed to the crystal transducer. The vertical axis oscilloscope setting was one ampere per centimeter, with a horizontal axis setting of one millisecond per centimeter. Capacitor 33 of circuit 20 of this invention was set at zero in FIG. 5. By referring to FIG. 5, the abrupt change in the envelope amplitude at the point where the frequency suddenly increases is readily seen.

In practice, the value of capacitor 33 may thus be reduced to zero, and the capacitance of capacitor 41 plus the interwinding capacitance of transformer 28 will still provide substantial capacitive effects.

This automatic frequency shift becomes even more apparent when FIG. 5 is compared to FIG. 6. In FIG. 6, the value of capacitor 33 is set at .004 microfarads. This FIG. 6 envelope is much more uniform in shape than the envelope of FIG. 5.

In FIG. 5, on both sides of the break point where the shift occurs from low frequency dominance to high frequency dominance, there is a combination of frequencies. The effect on the transducer 35 is a matter of the predominance of the frequencies which generate the transducer vibration. By introducing a capacitance across the primary winding, as shown in capacitor 33 in FIG. 1, a definite repetitive shift between the lower frequencies and the higher frequencies can be achieved. This has the effect of enhancing the cleaning activity, since this shift changes the cavitation which really does the cleaning. It has been found that establishing a mixture of frequencies within the half wave envelope, as indicated in FIG. 5, provides the best cleaning.

By controlling the level of capacitance across the primary winding of the transformer, the duration of low frequency dominance and automatic shifting timing can be controlled and effectively employed in order to provide the desired cavitation.

Figure 7:
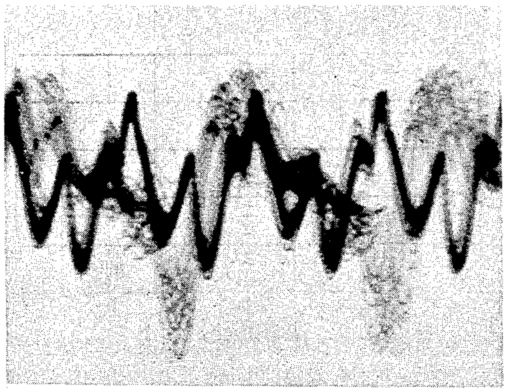
FIGS. 7 and 8 are photographs of an expanded oscilloscope display showing the load current waveform at a different scope time-axis setting, but at the same conditions as in FIGS. 5 and 6.
Figure 8:
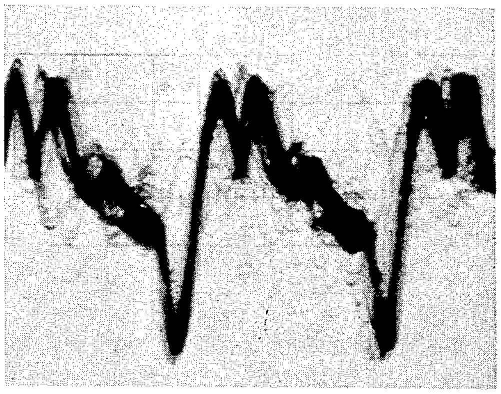

FIGS. 7 and 8 show the load current waveforms with the oscilloscope set at a horizontal time axis of 5 microseconds per centimeter and a vertical axis of 0.4 amperes per centimeter. In FIG. 7, the capacitance of capacitor 33 of circuit 20 of this invention is zero and, in FIG. 8, the capacitance is 0.004 microfarads. By comparing the waveform of FIG. 7 with the waveform of FIG. 8, it is readily seen that the waveform is altered by the introduction of the capacitor. By varying the values of capacitor 33 in the circuit 20 of this invention, the "integrating" effect of this capacitance and the associated internal circuit capacitance is changed, varying the balance between the plurality of the predominant frequencies represented in each oscillator output current pulse fed to transducer 35.

Figure 9:
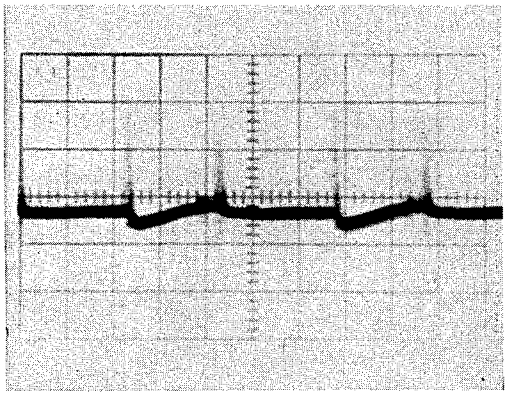
FIGS. 9 and 10 are photographs of an oscilloscope display showing the actual displacement of the bottom of the tank produced by the vibration of the crystal transducer.
Figure 10:
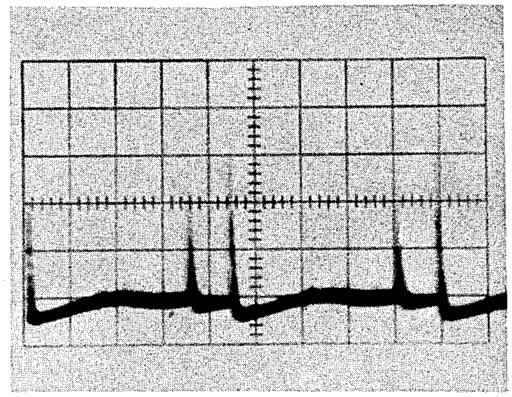

FIGS. 9 and 10 represent the physical displacement of the cleaning tank's bottom with water in the tank, displayed on the same horizontal time axis as in FIGS. 7 and 8. This representation of the mechanical output of the electrical system of this invention is achieved using a Fontonic sensor which optically measures the movement of the tank bottom. The spikes represent physical tank bottom displacement magnitudes. The magnitude of the spikes is about 660 micro-inches per centimeter. Furthermore, these spikes serve as operating frequency markers, and, as can be seen, correspond to the display in FIGS. 7 and 8, representing the load current waveforms.

In FIG. 9, the capacitance of capacitor 33 of circuit 20 of this invention is zero. In measuring the frequency of the spikes along the horizontal axis, which is set at 5 microseconds per centimeter, it is apparent that there are two major operating frequencies occurring at alternate intervals of 12 microseconds and 10 microseconds. In FIG. 10, in which capacitor 33 is set at a capacitance of 0.004 microfarads, the physical displacements represented by the spikes occur at alternate intervals of 17 microseconds and 5 microseconds.

A somewhat similar ocillator circuit incorporating a toroidal transformer with a feedback winding is shown in Puskas U.S. Pat. No. 3651,352, utilizing a simple capacitor across the transformer primary for "phase shift correction," producing an oscillator resonant frequency which is an even-multiple harmonic of the crystal's resonant frequency. Non linear independances and varying frequencies automatically shifted midpulse were not recognized or taught by Puskas.

By employing the electrical circuit of this invention for driving a piezoelectric transducer, and by adjusting the capacitance of the capacitor across the primary winding of the transformer in the circuit, automatic shifting between a plurality of frequencies can be controlled and adjusted for a particular use. Depending upon the size of the capacitor shunted across the primary winding of the transformer, the extent and timing of shifting from high frequency predominance to low frequency predominance can be effectively controlled to achieve the desired cavitation within the cleaning tank. As the value of the capacitor is increased, the varying frequencies are more completely integrated into a substantially more uniform frequency envelope. Each half-wave envelope initiates oscillations at a first, lower frequency range; and as the amplitude of the half-wave envelope increases, the frequency range shifts in part to a range of higher frequencies. The ultrasonic cavitation and cleaning is substantially enhanced by the sequential presence of these different frequencies.

It will be thus seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An oscillator circuit for sonic and ultrasonic cleaning apparatus comprising:

A. a transformer having a primary winding, a secondary winding, and a feedback loop winding;

B. a substantially unfiltered rectifier connectable to a source of alternating line current, and delivering direct current pulses to the primary winding of said transformer;

C. first capacitance means connected across the primary winding of said transformer;

D. a network incorporating a second capacitance means in series with a blocking diode together connected in parallel with said first capacitance means providing differing effective values of capacitance in parallel with said primary winding during positive and negative half cycles of said alternating line current;

E. said primary winding, said first capacitance means and said parallel network together presenting non-linear impedance characteristics to said rectifier;

F. a piezoelectric transducer connected to said secondary winding of said transformer and also forming part of said cleaning apparatus; and G. switching means connected to the primary winding of said transformer and the feedback loop winding of said transformer, thereby producing a circuit energizing said transducer with a pulse of oscillatory electrical energy having a plurality of different frequency components in response to each direct current pulse delivered to said primary winding, and providing automatic and controllable shifting between low frequency dominance and high frequency dominance during each said pulse.

2. The oscillator circuit defined in claim 1 wherein the substantially unfiltered rectifier is a half-wave rectifier.

3. The oscillator circuit defined in claim 1 wherein the substantially unfiltered rectifier is a full-wave rectifier.

4. The oscillator circuit defined in claim 1 wherein the first capacitance means includes a capacitor connected shunting the terminals of the primary winding of said transformer.

5. The oscillator circuit defined in claim 1 wherein said transformer is a ferrite core transformer.

6. The oscillator circuit defined in claim 1, wherein said primary, secondary and feedback loop windings are disposed on a toroidal core of said transformer.

7. The oscillator circuit defined in claim 1, wherein said switching means comprises a transistor.

8. The oscillator circuit defined in claim 4, wherein said capacitor has a variable capacitance between zero and 0.004 microfarads.

* * * * *